US012795821B2

(12) United States Patent
Tsuda et al.

(10) Patent No.: US 12,795,821 B2
(45) Date of Patent: Nov. 10, 2026

(54) PRINTED CIRCUIT BOARD

(71) Applicants: SUMITOMO ELECTRIC INDUSTRIES, LTD., Osaka (JP); SUMITOMO ELECTRIC PRINTED CIRCUITS, INC., Shiga (JP)

(72) Inventors: Yukie Tsuda, Osaka (JP); Koji Nitta, Osaka (JP); Takahiko Makino, Shiga (JP); Hiroki Nohara, Shiga (JP)

(73) Assignees: SUMITOMO ELECTRIC INDUSTRIES, LTD., Osaka (JP); SUMITOMO ELECTRIC PRINTED CIRCUITS, INC., Shiga (JP)

( * ) Notice: Subject to any disclaimer, the term of this patent is extended or adjusted under 35 U.S.C. 154(b) by 187 days.

(21) Appl. No.: 18/697,470

(22) PCT Filed: Jun. 7, 2023

(86) PCT No.: PCT/JP2023/021105

§ 371 (c)(1),
(2) Date: Mar. 31, 2024

(87) PCT Pub. No.: WO2023/243501

PCT Pub. Date: Dec. 21, 2023

(65) Prior Publication Data

US 2024/0407086 A1 Dec. 5, 2024

(30) Foreign Application Priority Data

Jun. 14, 2022 (JP) ................................ 2022-095738

(51) Int. Cl.
*H05K 1/02* (2006.01)
*H05K 3/18* (2006.01)

(52) U.S. Cl.
CPC .......... *H05K 1/0296* (2013.01); *H05K 3/188* (2013.01); *H05K 2201/0326* (2013.01);
(Continued)

(58) Field of Classification Search
CPC .................................................. H05K 1/0296
(Continued)

(56) References Cited

U.S. PATENT DOCUMENTS

2017/0133145 A1* 5/2017 Hong .................... H01F 41/042
2021/0153358 A1* 5/2021 Sakai ..................... C25D 5/022
2022/0167498 A1* 5/2022 Ueda .................... H05K 1/0296

FOREIGN PATENT DOCUMENTS

JP 2000-208881 A 7/2000
JP 2014013815 A 1/2014
(Continued)

*Primary Examiner* — Stanley Tso
(74) *Attorney, Agent, or Firm* — Renner, Otto, Boisselle & Sklar LLP

(57) ABSTRACT

A printed circuit board includes a base film having a main surface, and an electrically conductive pattern disposed on the main surface. A normal line of the main surface is along a first direction. The electrically conductive pattern includes a plurality of wiring portions disposed side by side along a second direction to be spaced apart from each other, the second direction being orthogonal to the first direction. The plurality of wiring portions include a first wiring portion and a second wiring portion that are each present at a corresponding one of both ends in the second direction and a plurality of third wiring portions that are present between the first wiring portion and the second wiring portion in the second direction.

4 Claims, 8 Drawing Sheets

(52) U.S. Cl.
CPC ................ *H05K 2201/0338* (2013.01); *H05K 2201/0344* (2013.01); *H05K 2203/0723* (2013.01)

(58) Field of Classification Search
USPC .......................................................... 174/250
See application file for complete search history.

(56) References Cited

FOREIGN PATENT DOCUMENTS

| | | | |
|---|---|---|---|
| JP | 2019-197851 | A | 11/2019 |
| WO | 2020/195526 | A1 | 10/2020 |

* cited by examiner

PRINTED CIRCUIT BOARD

TECHNICAL FIELD

The present disclosure relates to a printed circuit board. This application claims priority based on Japanese Patent Application No. 2022-095738 filed on Jun. 14, 2022, and the entire contents of the Japanese patent application are incorporated herein by reference.

BACKGROUND ART

For example, Japanese Unexamined Patent Application Publication No. 2019-197851 (PTL 1) describes a printed circuit board. The printed circuit board described in PTL 1 includes a base film having a main surface and an electrically conductive pattern disposed on the main surface.

The electrically conductive pattern includes a plurality of wiring portions. The plurality of wiring portions are arranged along a second direction orthogonal to a first direction in a cross-sectional view orthogonal to the first direction. The plurality of wiring portions include a first wiring portion and a second wiring portion that are each present at a corresponding one of both ends in the second direction and a plurality of third wiring portions that are present between the first wiring portion and the second wiring portion. The electrically conductive pattern includes a seed layer disposed on the main surface, an electroless plating layer disposed on the seed layer, and an electroplating layer disposed on the electroless plating layer.

In a method of manufacturing a printed circuit board described in PTL 1, first, the electroless plating layer is formed by performing electroless plating on the seed layer. Second, a resist pattern is formed on the electroless plating layer. In the resist pattern, opening portions extending through the resist pattern in a thickness direction are formed. Third, by performing electroplating, the electroplating layers on the electroless plating layer exposed from the opening portions of the resist pattern are formed. Fourth, the electroless plating layer and the seed layer exposed between the portions of the electroplating layer adjacent to each other with a space therebetween are removed by etching.

CITATION LIST

Patent Literature

PTL 1: Japanese Unexamined Patent Application Publication No. 2019-197851

SUMMARY OF INVENTION

A printed circuit board of the present disclosure includes a base film having a main surface, and an electrically conductive pattern disposed on the main surface. A normal line of the main surface is along a first direction. The electrically conductive pattern includes a plurality of wiring portions disposed side by side along a second direction to be spaced apart from each other, the second direction being orthogonal to the first direction. The plurality of wiring portions include a first wiring portion and a second wiring portion that are each present at a corresponding one of both ends in the second direction and a plurality of third wiring portions that are present between the first wiring portion and the second wiring portion in the second direction. In the second direction, a width of the first wiring portion and a width of the second wiring portion are each 1.1 times to 4.0 times an average value of widths of the plurality of third wiring portions.

DETAILED DESCRIPTION

Figure 1:
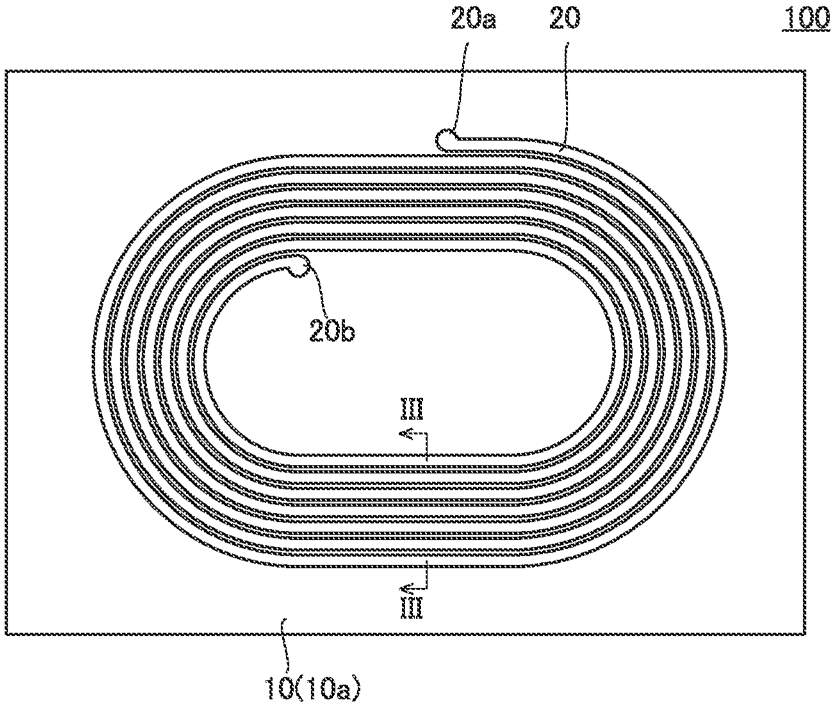
FIG. 1 is a plan view of a printed circuit board 100.

Problems to be Solved by Present Disclosure

In the method of manufacturing the printed circuit board described in PTL 1, when etching is performed to remove the electroless plating layer and the seed layer, the first wiring portion and the second wiring portion may be peeled off from the base film.

The present disclosure is to provide a printed circuit board in which peeling of an electrically conductive pattern from a base film can be suppressed.

Advantageous Effect of the Present Disclosure

According to the printed circuit board of the present disclosure, it is possible to suppress peeling of the electrically conductive pattern from the base film.

DESCRIPTION OF EMBODIMENTS

First, embodiments of the present disclosure will be listed and described.

(1) A printed circuit board according to an embodiment includes a base film having a main surface, and an electrically conductive pattern disposed on the main surface. A normal line of the main surface is along a first direction. The electrically conductive pattern includes a plurality of wiring portions disposed side by side along a second direction to be spaced apart from each other, the second direction being orthogonal to the first direction. The plurality of wiring portions include a first wiring portion and a second wiring portion that are each present at a corresponding one of both ends in the second direction and a plurality of third wiring portions that are present between the first wiring portion and the second wiring portion in the second direction. In the second direction, a width of the first wiring portion and a width of the second wiring portion are each 1.1 times to 4.0 times an average value of widths of the plurality of third wiring portions.

According to the printed circuit board of the above (1), it is possible to suppress peeling of the electrically conductive pattern from the base film.

(2) In the printed circuit board according to (1), the electrically conductive pattern may include a seed layer disposed on the main surface, an electroless plating layer disposed on the seed layer, and an electroplating layer disposed on the electroless plating layer. The electroless plating layer and the electroplating layer may be each made of copper.

According to the printed circuit board of the above (2), it is possible to suppress peeling of the electrically conductive pattern from the base film.

(3) In the printed circuit board according to the above (2), the width of the first wiring portion and the width of the second wiring portion may be each 5 μm to 60 μm.

According to the printed circuit board of the above (3), even when the width of the electrically conductive pattern is small and the electrically conductive pattern is likely to be peeled off from the base film, it is possible to suppress peeling of the electrically conductive pattern from the base film.

(4) In the printed circuit board according to the above (2) or (3), a thickness of the electrically conductive pattern may be 5 μm to 150 μm.

In the printed circuit board according to the above (4), even when the electrically conductive pattern is formed thick, it is possible to suppress peeling of the electrically conductive pattern from the base film.

(5) In the printed circuit board according to the above (2) to (4), a void density at an interface between the electroless plating layer and the electroplating layer may be 5.5 $\mu m^2/\mu m$ or less.

In the printed circuit board according to the above (5), even when many voids are generated at the interface between the electroless plating layer and the electroplating layer, it is possible to suppress peeling of the electrically conductive pattern from the base film.

(6) The printed circuit board according to the above (2) to (5), a distance between two of the plurality of wiring portions, the two being adjacent to each other in the second direction, may be 20 μm or less.

In the printed circuit board according to the above (6), even when side etching is likely to occur at the interface between the electroless plating layer and the electroplating layer, it is possible to suppress peeling of the electrically conductive pattern from the base film.

(7) In the printed circuit board according to the above (1) to (5), the electrically conductive pattern may be wound into a spiral shape in plan view and may form a coil. The first wiring portion may be present at an innermost periphery of the coil. The second wiring portion may be present at an outermost periphery of the coil.

DETAILED DESCRIPTION OF EMBODIMENTS

The details of embodiments of the present disclosure will be described with reference to the drawings. In the drawings, the same or corresponding parts are denoted by the same reference numerals, and the description thereof will not be repeated. A printed circuit board according to the embodiment is defined as a printed circuit board 100.

(Configuration of Printed Circuit Board 100)

A configuration of printed circuit board 100 will be described below.

Figure 2:
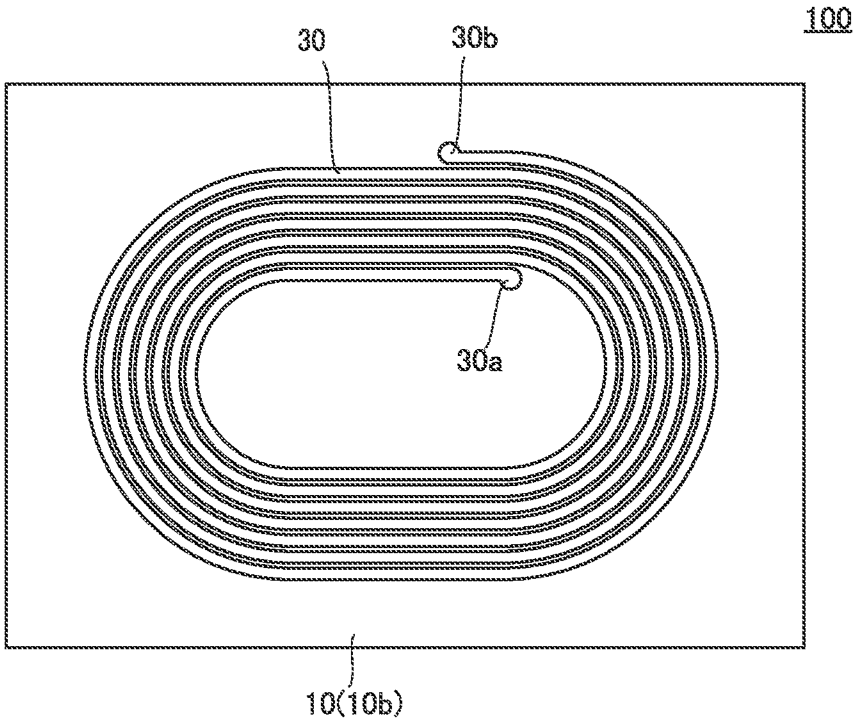
FIG. 2 is a bottom plan view of a printed circuit board 100.
Figure 3:
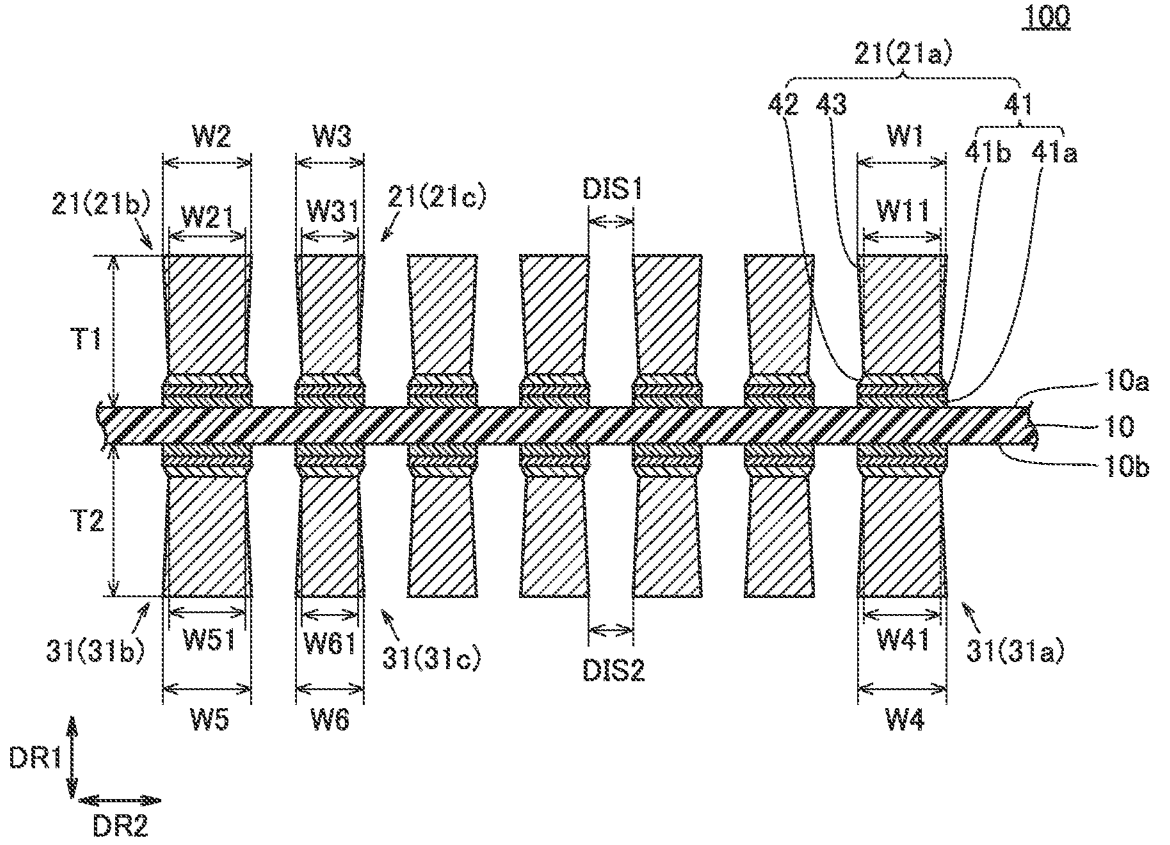
FIG. 3 is a cross-sectional view taken along the line III-III of FIG. 1.

FIG. 1 is a plan view of printed circuit board 100. FIG. 2 is a bottom plan view of printed circuit board 100. FIG. 2 shows printed circuit board 100 as viewed from the opposite side of FIG. 1. FIG. 3 is a cross-sectional view taken along line III-III of FIG. 1. As shown in FIGS. 1 to 3, printed circuit board 100 includes a base film 10, a first electrically conductive pattern 20, and a second electrically conductive pattern 30.

Base film 10 has a first main surface 10*a* and a second main surface 10*b*. First main surface 10*a* and second main surface 10*b* are end surfaces of base film 10 in a thickness direction. Second main surface 10*b* is a surface opposite to first main surface 10*a*. A normal line direction of first main surface 10*a* (a normal line direction of second main surface 10*b*) is defined as a first direction DR1. Base film 10 is made of a flexible material having electrical insulation properties. Base film 10 is made of, for example, polyimide, liquid crystal polymer, fluororesin, or the like.

First electrically conductive pattern 20 is wound into a spiral shape in plan view. That is, first electrically conductive pattern 20 forms a coil. First electrically conductive pattern 20 includes a plurality of wiring portions 21. The plurality of wiring portions 21 are disposed side by side along a second direction DR2 to be spaced apart from each other. Second direction DR2 is orthogonal to first direction DR1. In a portion where first electrically conductive pattern 20 extends linearly, second direction DR2 is a direction orthogonal to an extending direction of the portion. In a portion where first electrically conductive pattern 20 extends in a curved shape, second direction DR2 is a direction orthogonal to a tangential direction of the portion.

First electrically conductive pattern 20 has a land 20*a* at one end and a land 20*b* at the other end. Land 20*a* and land 20*b* are present at the outermost periphery and the innermost periphery of first electrically conductive pattern 20 wound into a spiral shape, respectively.

The plurality of wiring portions 21 include a first wiring portion 21*a*, a second wiring portion 21*b*, and a plurality of third wiring portions 21*c*. First wiring portion 21*a* and second wiring portion 21*b* are each present at a corresponding one of both ends in second direction DR2. From another viewpoint, first wiring portion 21*a* and second wiring portion 21*b* are portions present at the innermost periphery and the outermost periphery of first electrically conductive pattern 20 wound into a spiral shape, respectively. Third wiring portions 21*c* are present between first wiring portion 21*a* and second wiring portion 21*b* in second direction DR2. The "plurality of third wiring portions 21*c*" includes a case where the number of third wiring portions 21*c* is two or more and a case where the number of third wiring portions 21*c* is three or more.

A width of first wiring portion 21*a* in second direction DR2 and a width of second wiring portion 21*b* in second direction DR2 are defined as a width W1 and a width W2, respectively. Width W1 is measured at a position where the width of first wiring portion 21*a* in second direction DR2 is the maximum in a thickness direction, and width W2 is measured at a position where the width of second wiring portion 21*b* in second direction DR2 is the maximum in a thickness direction. Width W1 and width W2 are measured on a cross-sectional image obtained along second direction DR2.

A width of third wiring portion 21*c* in second direction DR2 is defined as a width W3. Width W3 is measured at a position where the width of third wiring portion 21*c* in second direction DR2 is the maximum in a thickness direction. Width W3 is measured on the cross-sectional image obtained along second direction DR2. Width W1 and width W2 are each 1.1 times to 4.0 times an average value of widths W3 of the plurality of third wiring portions 21*c*. Width W1 and width W2 may be each 1.5 times or more the average value of widths W3 of the plurality of third wiring portions 21*c*. Width W1 and width W2 may be each 5 μm to 60 μm, for example.

A distance between two adjacent wiring portions 21 in second direction DR2 is defined as a distance DIS1. Distance DIS1 is measured at a position where the distance between two adjacent wiring portions 21 in second direction DR2 is the smallest in the thickness direction. Distance DIS1 may be 5 μm or more and 20 μm or less.

A thickness of first electrically conductive pattern 20 is defined as a thickness T1. Thickness T1 is measured at a position where the thickness of first electrically conductive pattern 20 is the maximum value in a width direction. Thickness T1 is measured on the cross-sectional image obtained along second direction DR2. Thickness T1 is, for example, 5 μm to 150 μm. Thickness T1 may be 30 μm to 100 μm. In particular, when thickness T1 is large, first electrically conductive pattern 20 is likely to be peeled off, and thus thickness T1 may be 40 μm or more. Thickness T1 may be 60 μm or more.

Second electrically conductive pattern 30 is wound into a spiral shape in plan view. That is, second electrically conductive pattern 30 forms a coil. Second electrically conductive pattern 30 includes a plurality of wiring portions 31. The plurality of wiring portions 31 are disposed side by side along second direction DR2 to be spaced apart from each other. In a portion where second electrically conductive pattern 30 extends linearly, second direction DR2 is a direction orthogonal to an extending direction of the portion. In a portion where second electrically conductive pattern 30 extends in a curved shape, second direction DR2 is a direction orthogonal to a tangential direction of the portion.

Second electrically conductive pattern 30 has a land 30*a* at one end and a land 30*b* at the other end. Land 30*a* and land 30*b* are present at the innermost periphery and the outermost periphery of second electrically conductive pattern 30 wound into a spiral shape, respectively. Land 30*a* overlaps land 20*b* in plan view.

The plurality of wiring portions 31 include a first wiring portion 31*a*, a second wiring portion 31*b*, and a plurality of third wiring portions 31*c*. First wiring portion 31*a* and second wiring portion 31*b* are each present at a corresponding one of both ends in second direction DR2. From another viewpoint, first wiring portion 31*a* and second wiring portion 31*b* are portions present at the innermost periphery and the outermost periphery of second electrically conductive pattern 30 wound into a spiral shape, respectively. Third wiring portions 31*c* are present between first wiring portion 31*a* and second wiring portion 31*b* in second direction DR2. The "plurality of third wiring portions 31*c*" includes a case where the number of third wiring portions 31*c* is two or more and a case where the number of third wiring portions 31*c* is three or more.

A width of first wiring portion 31*a* in second direction DR2 and a width of second wiring portion 31*b* in second direction DR2 are defined as a width W4 and a width W5, respectively. Width W4 is measured at a position where the width of first wiring portion 31*a* in second direction DR2 is the maximum in a thickness direction, and width W5 is measured at a position where the width of second wiring portion 31*b* in second direction DR2 is the maximum in a thickness direction. Width W4 and width W5 are measured on the cross-sectional image obtained along second direction DR2.

A width of third wiring portion 31*c* in second direction DR2 is defined as a width W6. Width W6 is measured at a position where the width of third wiring portion 31*c* in second direction DR2 is the maximum in a thickness direction. Width W6 is measured on the cross-sectional image obtained along second direction DR2. Width W4 and width W5 are each 1.1 times to 4.0 times an average value of widths W6 of the plurality of third wiring portions 31*c*. Width W4 and width W5 may be each 1.5 times or more the average value of widths W6 of the plurality of third wiring portions 31*c*. Width W4 and width W5 may be, for example, 5 μm to 60 μm.

A distance between two adjacent wiring portions 31 in second direction DR2 is defined as a distance DIS2. Distance DIS2 is measured at a position where the distance between two adjacent wiring portions 31 in second direction DR2 is the smallest in the thickness direction. Distance DIS2 may be 5 μm to 20 μm.

A thickness of second electrically conductive pattern 30 is defined as a thickness T2. Thickness T2 is measured at a position where the thickness of second electrically conductive pattern 30 is the maximum value in a width direction. Thickness T2 is measured on the cross-sectional image obtained along second direction DR2. Thickness T2 is, for example, 5 μm to 150 μm. Thickness T2 may be 30 μm to 100 μm. In particular, when thickness T2 is large, second electrically conductive pattern 30 is likely to be peeled off, and thus thickness T2 may be 40 μm or more. Thickness T2 may be 60 μm or more.

Each of first electrically conductive pattern 20 and second electrically conductive pattern 30 includes a seed layer 41, an electroless plating layer 42, and an electroplating layer 43.

Seed layer 41 is disposed on a main surface (first main surface 10*a*, second main surface 10*b*) of base film 10. Seed layer 41 is, for example, a sputtered layer (a layer formed by sputtering). Seed layer 41 includes, for example, a first layer 41*a* and a second layer 41*b*. First layer 41*a* is disposed on the main surface (first main surface 10*a*, second main surface 10*b*) of base film 10. Second layer 41*b* is disposed on first layer 41*a*. First layer 41*a* may be a sputtered layer including a nickel-chromium alloy. Second layer 41*b* may be a sputtered layer containing copper.

Electroless plating layer 42 is a layer formed by electroless plating. Electroless plating layer 42 is disposed on seed layer 41. Electroless plating layer 42 is made of, for example, copper.

Although not shown, a through hole 10*c* is formed in base film 10. Through hole 10*c* extends through base film 10 in the thickness direction. Through hole 10*c* overlaps land 20*b* and land 30*a* in plan view. Electroless plating layer 42 is also formed on an inner wall surface of through hole 10*c*.

Electroplating layer 43 is a layer formed by electroplating. Electroplating layer 43 is disposed on electroless plating layer 42. Electroplating layer 43 is made of, for example, copper. Although not shown, electroplating layer 43 is also provided in through hole 10*c*. First electrically conductive pattern 20 and second electrically conductive pattern 30 are electrically connected to each other by electroplating layer 43 provided in through hole 10*c*. Accordingly, when voltage is applied between land 20*a* and land 30*b*, current flows in a spiral shape in first electrically conductive pattern 20 and second electrically conductive pattern 30, and the current generates a magnetic field.

A void density at an interface between electroless plating layer 42 and electroplating layer 43 is, for example, 5.5 $\mu m^2/\mu m$ or less. The void density at the interface between electroless plating layer 42 and electroplating layer 43 may be 0.01 $\mu m^2/\mu m$ or more. The void density at the interface between electroless plating layer 42 and electroplating layer 43 may be more than 0.01 $\mu m^2/\mu m$. The void density at the interface between electroless plating layer 42 and electroplating layer 43 may be 0.05 $\mu m^2/\mu m$ or more. The void density at the interface between electroless plating layer 42 and electroplating layer 43 is a value obtained by dividing the total area of the voids present at the interface between electroless plating layer 42 and electroplating layer 43 within a range of a predetermined observation length in a cross-sectional view by the observation length. More specifically, the void density at the interface between electroless plating layer 42 and electroplating layer 43 is measured by the following method.

First, a scanning electron microscope (SEM) image of the interface between electroless plating layer 42 and electroplating layer 43 is captured in a cross-section parallel to first direction DR1. The magnification of the SEM image is 10000 times to 50000 times. Second, the area of each of the plurality of voids present at the interface between electroless plating layer 42 and electroplating layer 43 is calculated by performing image processing on the SEM image. This image processing is performed by binarizing the image data so that the voids become black using software such as GNU Image Manipulation Program.

Third, the void density at the interface between electroless plating layer 42 and electroplating layer 43 is obtained by calculating a value obtained by dividing a sum of the areas of the plurality of voids present at the interface between electroless plating layer 42 and electroplating layer 43 having a predetermined length by the predetermined length.

A width of electroplating layer 43 at the interface with electroless plating layer 42 is referred to as a ground width. A ground width in first wiring portion 21*a*, a ground width in second wiring portion 21*b*, and a ground width in third wiring portion 21*c* are a ground width W11, a ground width W21, and a ground width W31, respectively. A ground width in first wiring portion 31*a*, a ground width in second wiring portion 31*b*, and a ground width in third wiring portion 31*c* are a ground width W41, a ground width W51, and a ground width W61, respectively.

(Method of Manufacturing Printed Circuit Board 100)

Hereinafter, a method of manufacturing printed circuit board 100 will be described.

Figure 4:
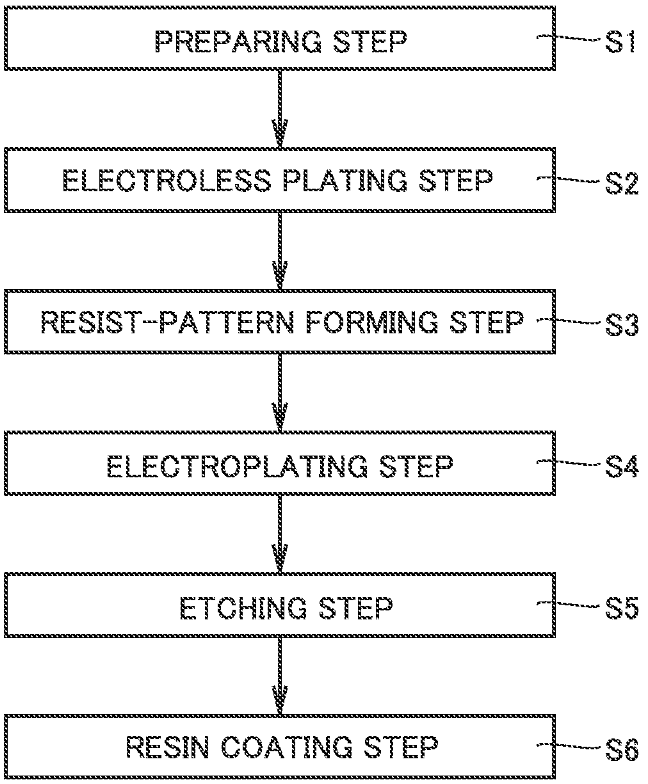
FIG. 4 is a step diagram showing a method of manufacturing a printed circuit board 100.

FIG. 4 is a step diagram showing a method of manufacturing printed circuit board 100. As shown in FIG. 4, the method of manufacturing printed circuit board 100 includes a preparing step S1, an electroless plating step S2, a resist-pattern forming step S3, an electroplating step S4, and an etching step S5.

Figure 5:
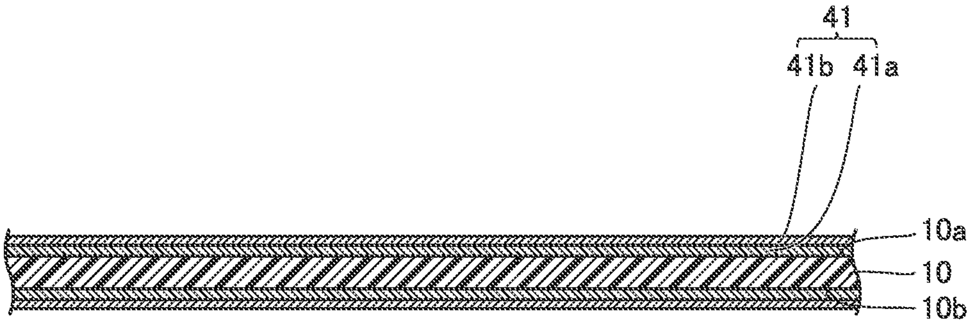
FIG. 5 is a cross-sectional view for explaining a preparing step S1.

FIG. 5 is a cross-sectional view for explaining preparing step S1. As shown in FIG. 5, in preparing step S1, base film 10 is prepared. Seed layer 41 is formed on each of the main surfaces (first main surface 10*a*, second main surface 10*b*) of base film 10 prepared in preparing step S1.

Figure 6:
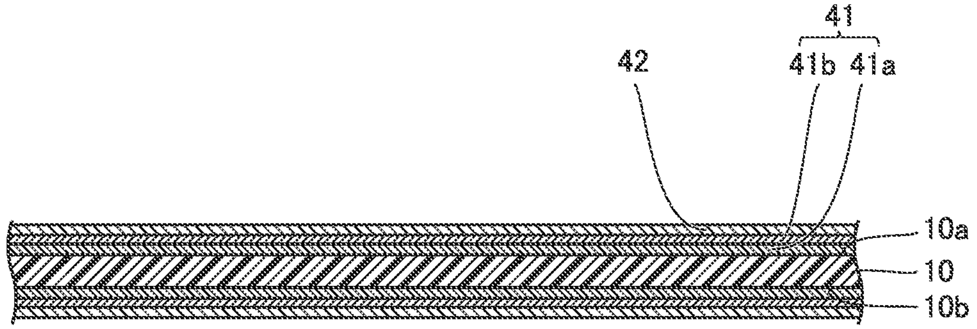
FIG. 6 is a cross-sectional view for explaining an electroless plating step S2.

FIG. 6 is a cross-sectional view for explaining electroless plating step S2. As shown in FIG. 6, in electroless plating step S2, the electroless plating is performed to form electroless plating layers 42 on seed layers 41. Although not shown, electroless plating layer 42 is also formed on through hole 10*c* by the electroless plating.

Figure 7:
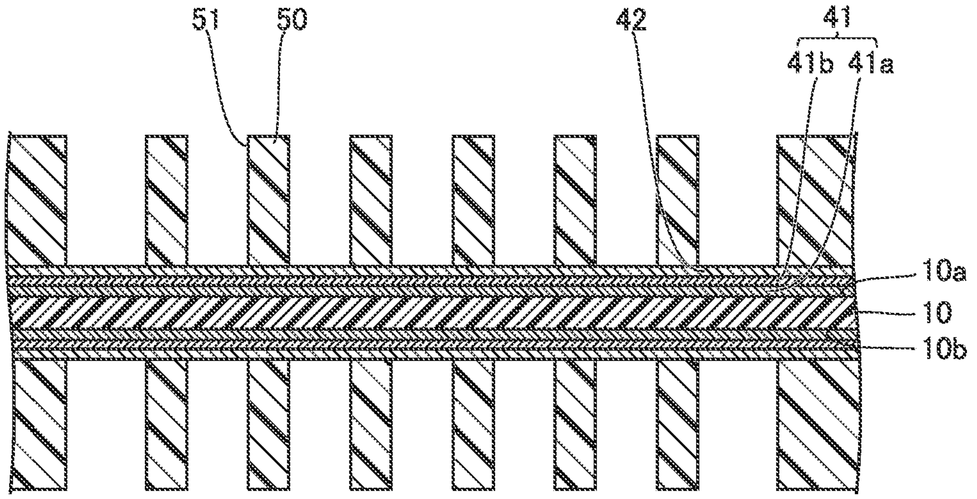
FIG. 7 is a cross-sectional view for explaining a resist-pattern forming step S3.

FIG. 7 is a cross-sectional view for explaining resist-pattern forming step S3. As shown in FIG. 7, in resist-pattern forming step S3, a resist pattern 50 is formed. Resist pattern 50 has a plurality of opening portions 51. Opening portion 51 extends through resist pattern 50 in a thickness direction. Electroless plating layer 42 is partially exposed from opening portion 51. Opening portion 51 is formed at a position where electroplating layer 43 is to be formed. When thickness T1 and thickness T2 are increased, resist pattern 50 is formed to be correspondingly thick.

In the formation of resist pattern 50, first, a dry film resist is attached onto electroless plating layer 42. Second, the dry film attached onto electroless plating layer 42 is exposed and developed. Accordingly, the dry film resist is partially removed to form resist pattern 50 having opening portions 51. Third, a surface of electroless plating layer 42 exposed from opening portion 51 is cleaned by, for example, plasma.

Figure 8:
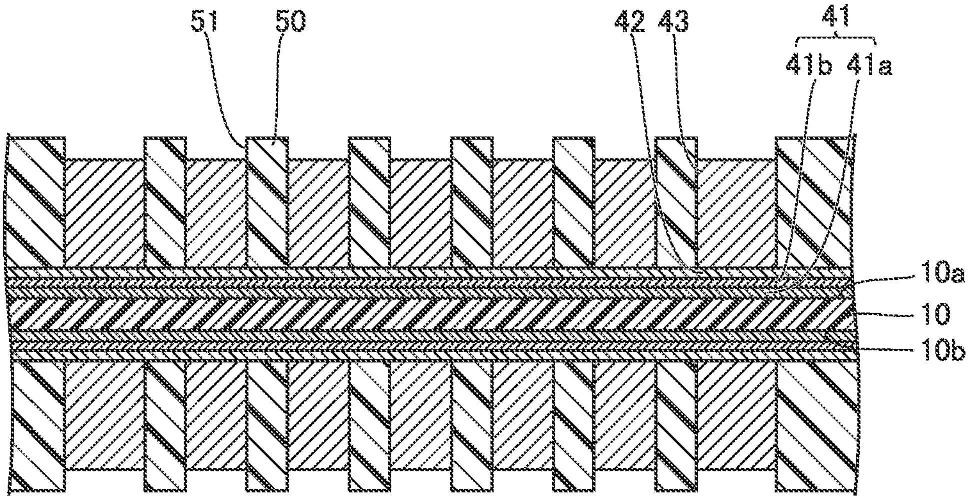
FIG. 8 is a cross-sectional view for explaining an electroplating step S4.

FIG. 8 is a cross-sectional view for explaining electroplating step S4. In electroplating step S4, as shown in FIG. 8, seed layer 41 and electroless plating layer 42 are electrified to perform electroplating, thereby forming electroplating layer 43 on electroless plating layer 42 exposed from opening portion 51. At this time, electroplating layer 43 is also provided in through hole 10*c*. Resist pattern 50 is removed after electroplating layer 43 is formed.

In etching step S5, electroless plating layer 42 and seed layer 41 exposed between the adjacent portions of electroplating layer 43 are removed by etching. As a result, printed circuit board 100 having a structure shown in FIGS. 1 to 3 is manufactured.

As shown in FIG. 4, after etching step S5 is performed, a resin coating step S6 is performed on printed circuit board 100. In resin coating step S6, first main surface 10*a* is coated with resin so as to cover first electrically conductive pattern 20, and second main surface 10*b* is coated with resin so as to cover second electrically conductive pattern 30. Although not shown, an electroplating step different from electroplating step S4 may be performed after etching step S5 is performed and before resin coating step S6 is performed. Thus, seed layer 41, electroless plating layer 42, and electroplating layer 43 are covered with an electroplating layer different from electroplating layer 43.

(Effects of Printed Circuit Board 100)

Hereinafter, effects of printed circuit board 100 will be described.

When etching step S5 is performed, an etching solution flows more easily and the etching proceeds more easily around first wiring portion 21*a* and second wiring portion 21*b* (first wiring portion 31*a* and second wiring portion 31*b*) than around third wiring portions 21*c* (third wiring portions 31*c*).

As a result, when first electrically conductive pattern 20 (second electrically conductive pattern 30) is designed such that width W1 and width W2 (width W4 and width W5) are equal to widths W3 (width W6), width W1 and width W2 (width W4 and width W5) become smaller than widths W3 (width W6), and first electrically conductive pattern 20 (second electrically conductive pattern 30) is likely to be peeled off from base film 10 at first wiring portion 21*a* and second wiring portion 21*b* (first wiring portion 31*a* and second wiring portion 31*b*). This becomes more apparent as the width of first electrically conductive pattern 20 (second electrically conductive pattern 30) becomes smaller.

Outside first wiring portion 21*a* and second wiring portion 21*b* (first wiring portion 31*a* and second wiring portion 31*b*), the vicinity of the boundary between electroless plating layer 42 and electroplating layer 43 is easily etched by the flow of the etching solution. Therefore, in printed circuit board 100, width W1 and width W2 (width W4 and width W5) are each 1.1 times to 4.0 times the average value of widths W3 (widths W6). As a result, the value obtained by dividing ground width W11 by the average value of ground widths W31 and the value obtained by dividing ground width W21 by the value of ground widths W31 (the value obtained by dividing ground width W41 by the average value of ground widths W61 and the value obtained by dividing the average-value of ground width W51 by the average value of ground widths W61) are often 1.0 or more. When resin coating step S6 is performed, force is more likely to be applied to first wiring portion 21*a* and second wiring portion 21*b* (first wiring portion 31*a* and second wiring portion 31*b*) than to third wiring portions 21*c* (third wiring portions 31*c*). However, since ground width W11 and ground width W21 (ground width W41 and ground width W51) are secured in printed circuit board 100, peeling of a part of first electrically conductive pattern 20 (second electrically conductive pattern 30) from base film 10 in first wiring portion 21*a* and second wiring portion 21*b* (first wiring portion 31*a* and second wiring portion 31*b*) is suppressed.

When thickness T1 (thickness T2) is to be increased (more specifically, to 40 μm or more), a thickness of resist pattern 50 needs to be increased. When the thickness of resist pattern 50 is increased, a depth of opening portion 51 is increased, and thus, the plasma for cleaning is less likely to reach the surface of electroless plating layer 42, and residues of the dry film resist are more likely to remain on the surface of electroless plating layer 42. As a result, voids are likely to be generated at the interface between electroless plating layer 42 and electroplating layer 43.

The voids present at the interface between electroless plating layer 42 and electroplating layer 43 become a factor of reducing adhesion between electroless plating layer 42 and electroplating layer 43. Further, when the voids are present at the interface between electroless plating layer 42 and electroplating layer 43, side etching along the interface between electroless plating layer 42 and electroplating layer 43 is likely to proceed in etching step S5. From another viewpoint, when the voids are present at the interface between electroless plating layer 42 and electroplating layer 43, a notch is likely to be formed at the interface between electroless plating layer 42 and electroplating layer 43 in etching step S5. The notch may be a starting point of peeling of first electrically conductive pattern 20 (second electrically conductive pattern 30).

When distance DIS1 (distance DIS2) becomes smaller (more specifically, 20 μm or less), the etching solution is less likely to enter between the adjacent portions of electroplating layer 43, and etching step S5 takes a long time. Therefore, the side etching is more likely to occur.

In printed circuit board 100, widths W1 and W2 (widths W4 and W5) are each 1.1 times to 4.0 times the average value of widths W3 (widths W6), and areas of the interface between electroless plating layer 42 and electroplating layer 43 in first wiring portion 21*a* and second wiring portion 21*b* (first wiring portion 31*a* and second wiring portion 31*b*) can be secured. Therefore, even when the adhesion is reduced and the notch is generated due to the voids, peeling of first electrically conductive pattern 20 (second electrically conductive pattern 30) from base film 10 at first wiring portion 21*a* and second wiring portion 21*b* (first wiring portion 31*a* and second wiring portion 31*b*) is suppressed.

EXAMPLES

In order to evaluate influence of each ratio of width W1 and width W2 to the average value of widths W3 on the peeling of first electrically conductive pattern 20, sample 1 to sample 7 were prepared. Ten samples were prepared for each of sample 1 through sample 7. Details of sample 1 to sample 7 are shown in Table 1. In sample 1 to sample 7, width W1, width W2, the average value of widths W3, thickness T1, and the void density at the interface between electroless plating layer 42 and electroplating layer 43 were changed.

The peeling occurrence rate in Table 1 was evaluated in three grades of "A", "B" and "C". "A" in Table 1 indicates that no peeling occurred in first electrically conductive pattern 20 (peeling occurrence rate: 0%). "B" and "C" in Table 1 indicate that peeling occurred in at least a portion of first electrically conductive pattern 20. More specifically, "B" and "C" in Table 1 indicate that the peeling occurrence rate is more than 0% and 20% or less and the peeling occurrence rate is more than 20% and 100% or less, respectively. The presence or absence of peeling of first electrically conductive pattern 20 was observed visually or using a microscope.

TABLE 1

| | Sample 1 | Sample 2 | Sample 3 | Sample 4 | Sample 5 | Sample 6 | Sample 7 |
|---|---|---|---|---|---|---|---|
| Thickness T1 (μm) | 60 | 60 | 60 | 60 | 60 | 60 | 60 |
| Void Density ($\mu m^2/\mu m$) | 6.00 | 0.01 | 0.01 | 0.01 | 0.01 | 0.05 | 6.00 |
| Width W1 · Width W2 (μm) | 25 | 40 | 35 | 40 | 60 | 40 | 40 |
| Average Value of Width W3 (μm) | 25 | 35 | 25 | 25 | 15 | 35 | 35 |
| Average Value of Width W1/Width W3 Average Value of Width W2/Width W3 | 1.0 | 1.1 | 1.4 | 1.6 | 4.0 | 1.1 | 1.1 |
| Ground Width W11 · Ground Width W21 (μm) | 16.5 | 31.6 | 27.0 | 31.6 | 51.6 | 31.2 | 29.6 |
| Average Value of Ground Width W31 (μm) | 18.8 | 28.4 | 18.8 | 18.8 | 11.3 | 28.4 | 28.4 |
| Average Value of Ground Width W11/Ground Width W31 Average Value of Ground Width W21/Ground Width W31 | 0.88 | 1.11 | 1.44 | 1.69 | 4.59 | 1.10 | 1.04 |
| Peeling Occurrence Rate of First Electrically Conductive Pattern 20 | C | A | A | A | A | A | B |

In sample 1 to sample 7, a value obtained by dividing width W1 by the average value of widths W3 and a value obtained by dividing width W2 by the average value of widths W3 were changed. In sample 1, the value obtained by dividing width W1 by the average value of widths W3 and the value obtained by dividing width W2 by the average value of widths W3 were less than 1.1, whereas in sample 2 to sample 7, the value obtained by dividing width W1 by the average value of widths W3 and the value obtained by dividing width W2 by the average value of widths W3 were in the range of 1.1 to 4.0.

In sample 1, the value obtained by dividing ground width W11 by the average value of ground widths W31 and the value obtained by dividing ground width W21 by the average value of ground widths W31 were less than 1.0. On the other hand, in sample 2 to sample 7, the value obtained by dividing ground width W11 by the average value of ground widths W31 and the value obtained by dividing ground width W21 by the average value of ground widths W31 were 1.0 or more. In addition, in sample 1, the evaluation of the peeling occurrence rate of first electrically conductive pattern 20 was C. On the other hand, in sample 2 to sample 7, the evaluations of the peeling occurrence rates of first electrically conductive pattern 20 were B or higher. From this, it was found that ground width W11 and ground width W21 can be made equal to or larger than ground width W31 by setting width W1 and width W2 to be 1.1 times to 4.0 times the average value of widths W3, and the peeling of a part of first electrically conductive pattern 20 in first wiring portion 21*a* and second wiring portion 21*b* can be suppressed.

In sample 2 to sample 6, the void densities at the interfaces between electroless plating layer 42 and electroplating layer 43 were 5.5 $\mu m^2/\mu m$ or less. In sample 7, the void density at the interface between electroless plating layer 42 and electroplating layer 43 was more than 5.5 $\mu m^2/\mu m$. In sample 2 to sample 6, the evaluations of the peeling occurrence rates of first electrically conductive pattern 20 were A. On the other hand, in sample 7, the evaluation of the peeling occurrence rate of first electrically conductive pattern 20 was B. From this, it was found that the peeling of a part of first electrically conductive pattern 20 in first wiring portion 21*a* and second wiring portion 21*b* can be further suppressed by setting the void density at the interface between electroless plating layer 42 and electroplating layer 43 to 5.5 $\mu m^2/\mu m$ or less.

Modification

In the above description, the case where printed circuit board 100 includes both first electrically conductive pattern 20 and second electrically conductive pattern 30 has been described, but printed circuit board 100 may not include any one of first electrically conductive pattern 20 and second electrically conductive pattern 30. In addition, in the above description, the case where first electrically conductive pattern 20 and second electrically conductive pattern 30 are wound into spiral shapes has been described, but first electrically conductive pattern 20 and second electrically conductive pattern 30 may not be wound into spiral shapes.

Although the case where first electrically conductive pattern 20 and second electrically conductive pattern 30 are formed by a semi-additive method (that is, the case where first electrically conductive pattern 20 and second electrically conductive pattern 30 includes seed layer 41, electroless plating layer 42, and electroplating layer 43) has been described in the above description, first electrically conductive pattern 20 and second electrically conductive pattern 30 may be formed by a subtractive method.

The embodiments disclosed herein are illustrative in all respects and should not be construed as limiting. The scope of the present invention is defined by the claims rather than the above embodiments, and is intended to include all modifications within the scope and meaning equivalent to the claims.

REFERENCE SIGNS LIST

10 base film, 10*a* first main surface, 10*b* second main surface, 10*c* through hole, 20 first electrically conductive pattern, 20*a*, 20*b* land, 21 wiring portion, 21*a* first wiring portion, 21*b* second wiring portion, 21*c* third wiring portion, 30 second electrically conductive pattern, 30*a*, 30*b* land, 31 wiring portion, 31*a* first wiring portion, 31*b* second wiring portion, 31*c* third wiring portion, 41 seed layer, 41*a* first layer, 41*b* second layer, 42 electroless plating layer, 43 electroplating layer, 50 resist pattern, 51 opening portion, 100 printed circuit board, DIS1 distance, DIS2 distance, DR1 first direction, DR2 second direction, S1 preparing step, S2 electroless plating step, S3 resist-pattern forming step, S4 electroplating step, S5 etching step, S6 resin coating step, T1, T2 thickness, W1, W2, W3, W4, W5, W6 width, W11, W21, W31, W41, W51, W61 ground width

The invention claimed is:

1. A printed circuit board comprising:

a base film having a main surface; and an electrically conductive pattern disposed on the main surface, wherein a normal line of the main surface is along a first direction, wherein the electrically conductive pattern includes a plurality of wiring portions disposed side by side along a second direction to be spaced apart from each other, the second direction being orthogonal to the first direction, wherein the plurality of wiring portions include a first wiring portion and a second wiring portion that are each present at a corresponding one of both ends in the second direction and a plurality of third wiring portions that are present between the first wiring portion and the second wiring portion in the second direction, wherein, in the second direction, a width of the first wiring portion and a width of the second wiring portion are each 1.1 times to 4.0 times an average value of widths of the plurality of third wiring portions, wherein the electrically conductive pattern is wound into a spiral shape in plan view and forms a coil, wherein the first wiring portion is present at an innermost periphery of the coil, wherein the second wiring portion is present at an outermost periphery of the coil, wherein the electrically conductive pattern includes a seed layer disposed on the main surface, an electroless plating layer disposed on the seed layer, and an electroplating layer disposed on the electroless plating layer, and wherein the electroless plating layer and the electroplating layer are each made of copper, wherein a void density at an interface between the electroless plating layer and the electroplating layer is 5.5 $\mu m^2/\mu m$ or less.

2. The printed circuit board according to claim 1, wherein the width of the first wiring portion and the width of the second wiring portion are each 5 μm to 60 μm.

3. The printed circuit board according to claim 1, wherein a thickness of the electrically conductive pattern is 5 μm to 150 μm.

4. The printed circuit board according to claim 1, wherein a distance between two of the plurality of wiring portions, the two being adjacent to each other in the second direction, is 20 μm or less.

* * * * *